US012689354B2

(12) United States Patent
Daimon et al.

(10) Patent No.: US 12,689,354 B2
(45) Date of Patent: Jul. 21, 2026

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Koji Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 918 days.

(21) Appl. No.: 17/987,926

(22) Filed: Nov. 16, 2022

(65) Prior Publication Data

US 2023/0071909 A1 Mar. 9, 2023

Related U.S. Application Data

(63) Continuation of application No. PCT/JP2021/019015, filed on May 19, 2021.

(30) Foreign Application Priority Data

May 27, 2020 (JP) ................................. 2020-092069

(51) Int. Cl.
*H03H 9/25* (2006.01)
*H03H 9/02* (2006.01)
*H03H 9/145* (2006.01)

(52) U.S. Cl.
CPC .......... *H03H 9/25* (2013.01); *H03H 9/02574* (2013.01); *H03H 9/14541* (2013.01); *H03H 9/1457* (2013.01)

(58) Field of Classification Search
CPC .... H03H 9/25; H03H 9/1457; H03H 9/14582; H03H 9/02574; H03H 9/14541; H03H 9/643

(Continued)

(56) References Cited

U.S. PATENT DOCUMENTS

2007/0024397 A1 2/2007 Otsuka et al.
2011/0068655 A1 3/2011 Solal et al.
(Continued)

FOREIGN PATENT DOCUMENTS

CN 106464229 A 2/2017
CN 110140296 A 8/2019
(Continued)

OTHER PUBLICATIONS

Official Communication issued in corresponding Chinese Patent Application No. 202180037473.7, mailed on Jun. 26, 2025, 7 pages.
(Continued)

*Primary Examiner* — Jorge L Salazar, Jr.

(74) *Attorney, Agent, or Firm* — Keating & Bennett, LLP

(57) ABSTRACT

An acoustic wave device includes a piezoelectric substrate and IDT electrodes each including a first pitch portion with a relatively wide electrode finger pitch and a second pitch portion with a relatively narrow electrode finger pitch. A central region is located on a central side in a direction in which electrode fingers extend, and first and second edge regions are located on both sides of the central region. Mass addition films are in the first and second edge regions and include first mass addition films in the first pitch portion and second mass addition films in the second pitch portion. A length of the first mass addition film along an acoustic wave propagation direction is greater than a length of the second mass addition film.

19 Claims, 6 Drawing Sheets

(58) Field of Classification Search
USPC .................................................. 333/193–196
See application file for complete search history.

(56) References Cited

U.S. PATENT DOCUMENTS

| | | | |
|---|---|---|---|
| 2012/0161577 A1 | 6/2012 | Abbott et al. | |
| 2016/0072475 A1* | 3/2016 | Mimura ............. | H03H 9/02992 |
| | | | 333/195 |
| 2017/0047905 A1 | 2/2017 | Araki et al. | |
| 2017/0155373 A1 | 6/2017 | Ruby et al. | |
| 2018/0269852 A1 | 9/2018 | Daimon et al. | |
| 2019/0158060 A1 | 5/2019 | Maeda | |
| 2019/0296715 A1 | 9/2019 | Okunaga | |
| 2019/0319601 A1 | 10/2019 | Takigawa | |
| 2021/0175872 A1 | 6/2021 | Daimon | |
| 2021/0265972 A1 | 8/2021 | Daimon | |

FOREIGN PATENT DOCUMENTS

| | | |
|---|---|---|
| JP | H11261370 A | 9/1999 |
| JP | 2006333171 A | 12/2006 |
| JP | 2012186808 A | 9/2012 |
| KR | 20160145742 A | 12/2016 |
| WO | 2015182522 A1 | 12/2015 |
| WO | 2017110586 A1 | 6/2017 |
| WO | 2018025962 A1 | 2/2018 |
| WO | 2018116680 A1 | 6/2018 |
| WO | 2018123657 A1 | 7/2018 |
| WO | 2020045442 A1 | 3/2020 |
| WO | 2020100744 A1 | 5/2020 |

OTHER PUBLICATIONS

International Search Report in PCT/JP2021/019015, mailed Jul. 20, 2021, 6 pages.
Written Opinion in PCT/JP2021/019015, mailed Jul. 20, 2021, 7 pages.

* cited by examiner

1

ACOUSTIC WAVE DEVICE

CROSS REFERENCE TO RELATED APPLICATIONS

This application claims the benefit of priority to Japanese Patent Application No. 2020-092069 filed on May 27, 2020 and is a Continuation Application of PCT Application No. PCT/JP2021/019015 filed on May 19, 2021. The entire contents of each application are hereby incorporated herein by reference.

BACKGROUND OF THE INVENTION

1. Field of the Invention

The present invention relates to an acoustic wave device.

2. Description of the Related Art

Existing acoustic wave devices have been widely used in filters of mobile phones and the like.

Japanese Unexamined Patent Application Publication No. 2006-333171 discloses an example of a surface acoustic wave resonator. In the surface acoustic wave resonator, a plurality of interdigital transducer (IDT) electrodes is provided on a piezoelectric substrate. The plurality of IDT electrodes is disposed along an acoustic wave propagation direction. An electrode finger pitch of a portion of each IDT electrode is different from the electrode finger pitch of the other portion.

In an acoustic wave device disclosed in International Publication No. 2017/110586, an IDT electrode includes a central region and a pair of edge regions. The pair of edge regions is disposed so as to sandwich the central region in a direction in which electrode fingers extend. A mass addition film is provided on the IDT electrode in the edge region. The mass addition film extends along the acoustic wave propagation direction. Thus, suppression of a transverse mode using a piston mode is achieved.

When the IDT electrode has a portion in which the electrode finger pitch is relatively narrow and a portion in which the electrode finger pitch is relatively wide as in the IDT electrode in Japanese Unexamined Patent Application Publication No. 2006-333171, the transverse mode cannot be sufficiently suppressed even when the mass addition film is provided as in International Publication No. 2017/110586.

SUMMARY OF THE INVENTION

Preferred embodiments of the present invention provide acoustic wave devices, each of which is capable of effectively suppressing a transverse mode.

In a wide aspect of a preferred embodiment of the present invention, an acoustic wave device includes a piezoelectric substrate, and a plurality of IDT electrodes extending in an acoustic wave propagation direction on the piezoelectric substrate and each including a pair of busbars and a plurality of electrode fingers, wherein at least one of the plurality of IDT electrodes includes a first pitch portion in which an electrode finger pitch is relatively wide and a second pitch portion in which an electrode finger pitch is relatively narrow, a portion in which the electrode fingers adjacent to each other overlap each other in the acoustic wave propagation direction is an intersecting region, the intersecting region includes a central region located on a central side in a direction in which the electrode fingers extend, and a pair of edge regions on both sides of the central region in the direction in which the electrode fingers extend and including respective tip portions of the electrode fingers, in each of the IDT electrodes, a pair of gap regions is between the intersecting region and the pair of busbars, a plurality of mass addition films overlap portions of the electrode fingers in the pair of edge regions in a plan view, the plurality of mass addition films includes a plurality of first mass addition films in the first pitch portion and a plurality of second mass addition films in the second pitch portion, the first mass addition film overlaps at least one of the electrode fingers in a plan view, each of the second mass addition films overlaps one of the electrode fingers and does not overlap another of the electrode fingers adjacent to the one of the electrode fingers in a plan view, and a length of one of the first mass addition films along the acoustic wave propagation direction is greater than a length of one of the second mass addition films along the acoustic wave propagation direction.

In another wide aspect of a preferred embodiment of the present invention, an acoustic wave device includes a piezoelectric substrate, and a plurality of IDT electrodes extending in an acoustic wave propagation direction on the piezoelectric substrate and each including a pair of busbars and a plurality of electrode fingers, wherein at least one of the IDT electrodes includes a first pitch portion in which an electrode finger pitch is relatively wide and a second pitch portion in which an electrode finger pitch is relatively narrow, a portion in which the electrode fingers adjacent to each other overlap each other in the acoustic wave propagation direction is an intersecting region, the intersecting region includes a central region located on a central side in a direction in which the electrode fingers extends, and a pair of edge regions disposed on both sides of the central region in the direction in which the electrode fingers extends and including respective tip portions of the plurality of electrode fingers, in each of the IDT electrodes, a pair of gap regions is between the intersecting region and the pair of busbars, a width of the plurality of electrode fingers in the first pitch portion in the pair of edge regions is greater than a width of the plurality of electrode fingers in the central region, a width of the plurality of electrode fingers in the second pitch portion in the pair of edge regions is equal to or less than a width of the plurality of electrode fingers in the central region, a plurality of mass addition films overlap portions of the plurality of electrode fingers in the first pitch portion and the second pitch portion located in the pair of edge regions in a plan view, and each of the mass addition films overlaps the electrode fingers and a portion located between the electrode fingers in a plan view.

With acoustic wave devices according to preferred embodiments of the present invention, it is possible to effectively suppress a transverse mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

It should be noted that the preferred embodiments described in the present specification are merely examples, and partial replacement or combination of configurations is possible between different preferred embodiments.

Figure 1:
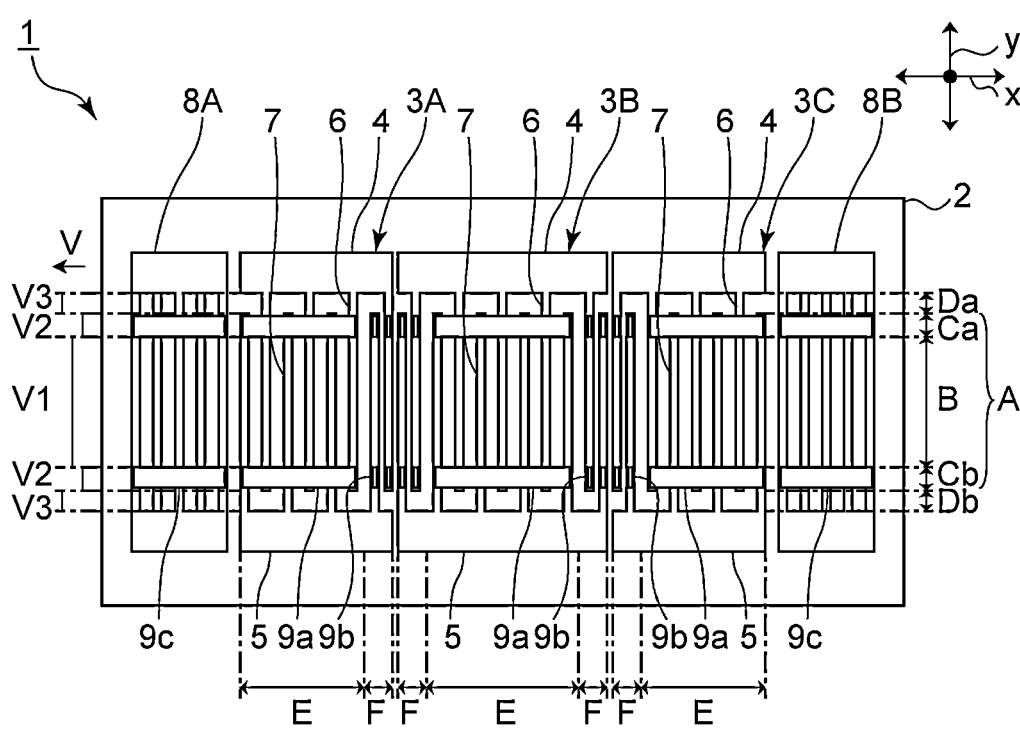
FIG. 1 is a plan view of an acoustic wave device according to a first preferred embodiment of the present invention.

FIG. 1 is a plan view of an acoustic wave device according to a first preferred embodiment of the present invention.

An acoustic wave device 1 of the present preferred embodiment is a longitudinally coupled resonator-type acoustic wave filter. The acoustic wave device 1 has a piezoelectric substrate 2.

A plurality of IDT electrodes is provided on the piezoelectric substrate 2. To be more specific, an IDT electrode 3A, an IDT electrode 3B, and an IDT electrode 3C are provided on the piezoelectric substrate 2. As described above, the acoustic wave device 1 includes three IDT electrodes. However, the number of IDT electrodes is not limited to the above number.

The IDT electrode 3A includes a pair of busbars and a plurality of electrode fingers. To be more specific, the IDT electrode 3A includes a first busbar 4, a second busbar 5, a plurality of first electrode fingers 6, and a plurality of second electrode fingers 7. The first busbar 4 and the second busbar 5 face each other. One end of each of the plurality of first electrode fingers 6 is connected to the first busbar 4. One end of each of the plurality of second electrode fingers 7 is connected to the second busbar 5. The plurality of first electrode fingers 6 and the plurality of second electrode fingers 7 are interdigitated with each other. Note that in this specification, the first electrode fingers 6 or the second electrode fingers 7 may be simply referred to as electrode fingers. Each of the IDT electrode 3B and the IDT electrode 3C also has a pair of busbars and a plurality of electrode fingers.

An acoustic wave is excited by applying an AC voltage to the IDT electrode 3A. The same applies to the IDT electrode 3B and the IDT electrode 3C. The plurality of IDT electrodes is arranged in the acoustic wave propagation direction. More particularly, the IDT electrode 3B is disposed between the IDT electrode 3A and the IDT electrode 3C.

Here, the acoustic wave propagation direction is defined as a first direction x, and a direction in which the plurality of electrode fingers extends is defined as a second direction y. The first direction x and the second direction y are orthogonal to each other. A pair of reflectors 8A and 8B are provided on the piezoelectric substrate 2 on both sides of the plurality of IDT electrodes in the first direction x. To be more specific, the reflector 8A and the reflector 8B are disposed so as to sandwich the IDT electrode 3A, the IDT electrode 3B, and the IDT electrode 3C. The reflector 8A is adjacent to the IDT electrode 3A and the reflector 8B is adjacent to the IDT electrode 3C. The IDT electrode 3A, the IDT electrode 3B, and the IDT electrode 3C, and the reflector 8A and the reflector 8B may be formed of a single-layer metallic film or a laminated metallic film.

As illustrated in FIG. 1, the IDT electrode 3B includes a first pitch portion E and a second pitch portion F. In the first pitch portion E, the electrode finger pitch is relatively wide. In the second pitch portion F, the electrode finger pitch is relatively narrow. The electrode finger pitch is a distance between the centers of adjacent electrode fingers. In each of the IDT electrode 3B, one first pitch portion E and two second pitch portions F are arranged. To be more specific, the first pitch portion E is located at the center of the IDT electrode 3B in the first direction x. The pair of second pitch portions F is located on both sides of the first pitch portion E in the first direction x.

On the other hand, in the IDT electrode 3A, the second pitch portion F is located on the IDT electrode 3B side. The other portions in the IDT electrode 3A are configured as the first pitch portion E. Similarly, in the IDT electrode 3C, the second pitch portion F is located on the IDT electrode 3B side. The other portions of the IDT electrode 3C are configured as the first pitch portion E. Since each IDT electrode includes the first pitch portion E and the second pitch portion F, the steepness in the filter characteristics can be increased. Note that in this specification, "high steepness" refers to an amount of change in frequency being small with respect to a certain amount of change in attenuation in the vicinity of the end portion of the pass band.

The arrangement of the first pitch portion E and the second pitch portion F in each IDT electrode is not limited to that described above. At least one of the plurality of IDT electrodes only needs to have the first pitch portion E and the second pitch portion F.

In the present preferred embodiment, the width of the electrode fingers in the first pitch portion E and the width of the electrode fingers in the second pitch portion F are the same. The width of the electrode finger is a dimension in the first direction x of the electrode finger. The width of each electrode finger is constant in the second direction y. Note that, for example, the width of the electrode fingers in the second pitch portion F may be narrower than the width of the electrode fingers in the first pitch portion E.

Here, in each IDT electrode, a portion where adjacent electrode fingers overlap each other in the first direction x is an intersecting region A. The intersecting region A includes a central region B and a pair of edge regions. The central region B is located on the central side in the second direction y. Specifically, the pair of edge regions is a first edge region Ca and a second edge region Cb. The first edge region Ca and the second edge region Cb are disposed on both sides of the central region B in the second direction y. The first edge region Ca is located on the first busbar 4 side. The second edge region Cb is located on the second busbar 5 side. In the present preferred embodiment, the central regions B of all the IDT electrodes overlap each other when viewed in the first direction x. When viewed from the first direction x, the first edge regions Ca of all the IDT electrodes overlap each other. Further, when viewed from the first direction x, the second edge regions Cb of all the IDT electrodes overlap each other.

A plurality of mass addition films is provided so as to overlap portions of the plurality of electrode fingers located in the first edge region Ca and the second edge region Cb in a plan view. To be more specific, a plurality of mass addition films is provided on each of the IDT electrode 3A, the IDT electrode 3B, and the IDT electrode 3C. The plurality of mass addition films includes a first mass addition film 9a provided in each of the first edge region Ca and the second edge region Cb, and a second mass addition film 9b provided in each of the first edge region Ca and the second edge region Cb. In other words, the plurality of mass addition films includes a plurality of the first mass addition films 9a and a plurality of the second mass addition films 9b.

The first mass addition film 9a has a band shape and is disposed in the first pitch portion E. Each of the first mass addition films 9a is provided over a plurality of electrode fingers. To be more specific, the first mass addition film 9a is provided not only on the plurality of electrode fingers but also on portions located between the plurality of electrode fingers on the piezoelectric substrate 2.

On the other hand, the second mass addition film 9b is disposed in the second pitch portion F. Each of the second mass addition films 9b is provided on one of the electrode fingers. The second mass addition film 9b is not disposed between the electrode fingers. Here, the dimension of the mass addition film in the first direction x is a length of the mass addition film. The length of the first mass addition film 9a is greater than the length of the second mass addition film 9b. The first mass addition film 9a and the second mass addition film 9b may be a metallic film or a dielectric film.

Some of the unique features of the present preferred embodiment are as follows. 1) At least one IDT electrode has the first pitch portion E and the second pitch portion F. 2) The band-shaped first mass addition film 9a is disposed in the first pitch portion E. 3) The second mass addition film 9b is disposed in the second pitch portion F. 4) The length of the first mass addition film 9a is greater than the length of the second mass addition film 9b. 5) The first mass addition film 9a and the second mass addition film 9b overlap the portions of the electrode finger located in the first edge region Ca and the second edge region Cb in a plan view. As a result, the transverse mode can be effectively suppressed. This will be described in more detail below.

In the first edge region Ca, the first mass addition film 9a and the second mass addition film 9b are provided. Therefore, the acoustic velocity in the first edge region Ca is low. Thus, a low acoustic velocity region is formed in the first edge region Ca. The low acoustic velocity region is a region where the acoustic velocity in the region is lower than the acoustic velocity in the central region B. Similarly, a low acoustic velocity region is formed also in the second edge region Cb. When the acoustic velocity in the central region B is V1 and the acoustic velocity in the low acoustic velocity region is V2, V2<V1 is satisfied.

As illustrated in FIG. 1, the first edge region Ca and the second edge region Cb are disposed in an outer side portion of the central region B in the second direction y. That is, the low acoustic velocity region is disposed in the outer side portion of the central region B in the second direction y. As a result, the transverse mode can be suppressed.

Here, the inventor of preferred embodiments of the present invention has discovered that the condition for suppressing the transverse mode is different between the first pitch portion and the second pitch portion. For example, it is assumed that the width of each electrode finger of the IDT electrode is constant in the second direction, and the same mass addition film is provided in the first pitch portion and the second pitch portion. In this case, it is difficult to sufficiently satisfy the conditions for suppressing the transverse mode in both the first pitch portion and the second pitch portion. Therefore, it is difficult to sufficiently suppress the transverse mode.

On the other hand, in the present preferred embodiment, the band-shaped first mass addition film 9a is disposed in the first pitch portion E, and the second mass addition film 9b is disposed in the second pitch portion F. As a result, the conditions for suppressing the transverse mode can be suitably satisfied in both the first pitch portion E and the second pitch portion F. Therefore, the transverse mode can be effectively suppressed in the acoustic wave device 1 as a whole.

Each of the IDT electrodes 3A, 3B, and 3C includes a pair of gap regions. The pair of gap regions is disposed between the intersecting region A and the pair of busbars in each IDT electrode. Specifically, the pair of gap regions is a first gap region Da and a second gap region Db. The first gap region Da is located between the first busbar 4 and the plurality of second electrode fingers 7. In the first gap region Da, only the first electrode fingers 6 of the first electrode fingers 6 and the second electrode fingers 7 are disposed. Thus, a high acoustic velocity region is formed in the first gap region Da. The high acoustic velocity region is a region where the acoustic velocity in the region is higher than the acoustic velocity in the central region B.

On the other hand, the second gap region Db is located between the second busbar 5 and the plurality of first electrode fingers 6. In the second gap region Db, only the second electrode fingers 7 of the first electrode fingers 6 and the second electrode fingers 7 are disposed. Thus, a high acoustic velocity region is formed in the second gap region Db. When the acoustic velocity in the high acoustic velocity region is V3, V1<V3 is satisfied. The relationship between the acoustic velocities in the low acoustic velocity region, the central region B, and the high acoustic velocity region is V2<V1<V3. FIG. 1 illustrates the relationship between the acoustic velocities described above. Note that in the portion indicating the relationship between the acoustic velocities in FIG. 1, as indicated by an arrow V, the acoustic velocity is higher as the line indicating the height of each acoustic velocity is located on the left side.

In the IDT electrode 3A, the IDT electrode 3B, and the IDT electrode 3C, in the second direction y, the low acoustic velocity region is arranged in the outer side portion of the central region B, and the high acoustic velocity region is arranged in the outer side portion of the low acoustic velocity region. As a result, the transverse mode can be suppressed effectively and more reliably.

Here, the dimension of the mass addition film in the second direction y is defined as the width of the mass addition film. The dimension of the low acoustic velocity region in the second direction y is defined as the width of the low acoustic velocity region. As illustrated in FIG. 1, the width of the first mass addition film 9a and the width of the second mass addition film 9b are the same. Thus, discontinuity does not occur in the width of the low acoustic velocity region. Therefore, the deterioration of the insertion loss can be reduced or prevented. Note that the width of the first mass addition film 9a and the width of the second mass addition film 9b may be different from each other.

In the present preferred embodiment, one first mass addition film 9a is provided in the first edge region Ca for each first pitch portion E. However, the plurality of first mass addition films 9a may be provided in the first edge region Ca for each first pitch portion E. For example, each of the first mass addition films 9a may be provided so as to extend over two electrode fingers. In this case, different first mass addition films 9a are disposed on every two electrode fingers.

Similarly, in the present preferred embodiment, one first mass addition film 9a is provided in the second edge region Cb for each first pitch portion E. However, the plurality of first mass addition films 9a may be provided in the second edge region Cb for each first pitch portion E.

Each of the second mass addition films 9b is not provided between the electrode fingers. However, the second mass addition film 9b may extend to a portion between the electrode fingers on the piezoelectric substrate 2. Each of the second mass addition films 9b may be provided so as to overlap one electrode finger and not to overlap an electrode finger adjacent to the electrode finger in a plan view.

Other configurations of the present preferred embodiment will be described in detail below.

Figure 2:
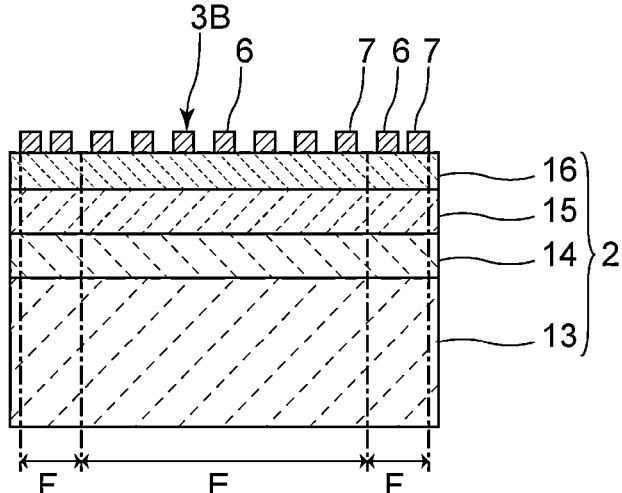
FIG. 2 is a front cross-sectional view illustrating a portion of the acoustic wave device according to the first preferred embodiment of the present invention.

FIG. 2 is a front cross-sectional view illustrating a portion of the acoustic wave device according to the first preferred embodiment. Note that FIG. 2 illustrates a cross section of a portion where the IDT electrode 3B is provided in the central region B.

The piezoelectric substrate 2 is a laminated substrate including a piezoelectric layer 16. More specifically, in the piezoelectric substrate 2, a support substrate 13, a high acoustic velocity film 14 as a high acoustic velocity material layer, a low acoustic velocity film 15, and the piezoelectric layer 16 are laminated in this order. The above-described IDT electrode 3A, the IDT electrode 3B, the IDT electrode 3C, the reflector 8A, and the reflector 8B are provided on the piezoelectric layer 16.

The piezoelectric layer 16 is a lithium tantalate layer. Note that the material of the piezoelectric layer 16 is not limited to the above, and for example, lithium niobate or the like can be used. Here, the wavelength defined by the average value of the electrode finger pitches of the IDT electrode is defined as $\lambda$. In the present preferred embodiment, the thickness of the piezoelectric layer 16 is equal to or less than about $1\lambda$, for example. However, the thickness of the piezoelectric layer 16 is not limited to the above.

The low acoustic velocity film 15 is a film having a relatively low acoustic velocity. More specifically, the acoustic velocity of a bulk wave propagating through the low acoustic velocity film 15 is lower than the acoustic velocity of a bulk wave propagating through the piezoelectric layer 16. The low acoustic velocity film 15 is a silicon oxide film. Silicon oxide can be represented by $SiO_x$. In the present preferred embodiment, the low acoustic velocity film 15 is a $SiO_2$ film. It should be noted that the material of the low acoustic velocity film 15 is not limited to the above, and for example, a material containing glass, silicon oxynitride, tantalum oxide, or a compound obtained by adding fluorine, carbon, or boron to silicon oxide as a main component may be used.

The high acoustic velocity material layer is a layer having a relatively high acoustic velocity. More specifically, the acoustic velocity of a bulk wave propagating through the high acoustic velocity material layer is higher than the acoustic velocity of an acoustic wave propagating through the piezoelectric layer 16. The high acoustic velocity film 14 as a high acoustic velocity material layer is a silicon nitride film. Note that the material of the high acoustic velocity film 14 is not limited to the above, and, for example, a medium containing the above material as a main component, such as silicon, aluminum oxide, silicon carbide, silicon oxynitride, sapphire, lithium tantalate, lithium niobate, quartz crystal, alumina, zirconia, cordierite, mullite, steatite, forsterite, magnesia, a diamond-like carbon (DLC) film, or diamond, may also be used.

In the present preferred embodiment, the support substrate 13 is a silicon substrate. Note that the material of the support substrate 13 is not limited to the above, and, for example, a piezoelectric body such as aluminum oxide, lithium tantalate, lithium niobate, or quartz crystal, various ceramics such as alumina, magnesia, silicon nitride, aluminum nitride, silicon carbide, zirconia, cordierite, mullite, steatite, or forsterite, a dielectric such as sapphire, diamond, or glass, a semiconductor such as gallium nitride, or a resin and the like may also be used.

In the piezoelectric substrate 2, the high acoustic velocity film 14, the low acoustic velocity film 15, and the piezoelectric layer 16 are laminated in this order. Since the piezoelectric substrate 2 has such a laminated structure, the Q value can be increased, and the energy of the acoustic wave can be effectively confined to the piezoelectric layer 16 side.

However, the laminated structure of the piezoelectric substrate 2 is not limited to that described above. For example, the piezoelectric substrate 2 does not have to have the low acoustic velocity film 15. In this case, the piezoelectric substrate 2 may be a three-layer laminated substrate. Specifically, in the piezoelectric substrate 2, the support substrate 13, the high acoustic velocity film 14, and the piezoelectric layer 16 may be laminated in this order.

The high acoustic velocity material layer may be a high acoustic velocity support substrate. Also in this case, the piezoelectric substrate 2 may be a three-layer laminated substrate. Specifically, in the piezoelectric substrate 2, the high acoustic velocity support substrate, the low acoustic velocity film 15, and the piezoelectric layer 16 may be laminated in this order. Alternatively, the piezoelectric substrate 2 may be a two-layer laminated substrate. Specifically, in the piezoelectric substrate 2, the high acoustic velocity support substrate and the piezoelectric layer 16 may be laminated in this order. Also in these cases, the Q value can be increased. Note that the piezoelectric substrate 2 may be a piezoelectric substrate composed only of the piezoelectric layer 16.

As the material of the high acoustic velocity support substrate, for example, a medium containing the above-described material as a main component, such as silicon, aluminum oxide, silicon carbide, silicon nitride, silicon oxynitride, sapphire, lithium tantalate, lithium niobate, quartz crystal, alumina, zirconia, cordierite, mullite, steatite, forsterite, magnesia, a DLC (diamond-like carbon) film, or diamond can be used.

As illustrated in FIG. 1, a mass addition film 9c is provided on each of the reflector 8A and the reflector 8B.

The mass addition film 9c is band-shaped like the first mass addition film 9a. However, the mass addition film 9c need not be provided on the reflector 8A and the reflector 8B.

In the present preferred embodiment, the acoustic wave device 1 is a longitudinally coupled resonator-type acoustic wave filter. However, the acoustic wave device 1 is not limited thereto, and may be a transversal filter device or the like. In this case, the reflector 8A and the reflector 8B need not be provided.

Hereinafter, a first modification and a second modification of the first preferred embodiment will be described. In the first modification and the second modification, the shape of the electrode fingers of the IDT electrode 3A, the IDT electrode 3B, and the IDT electrode 3C in the first pitch portion E or the second pitch portion F is different from that of the first preferred embodiment. In the first modification and the second modification as well, the transverse mode can be effectively suppressed as in the first preferred embodiment.

Figure 3:
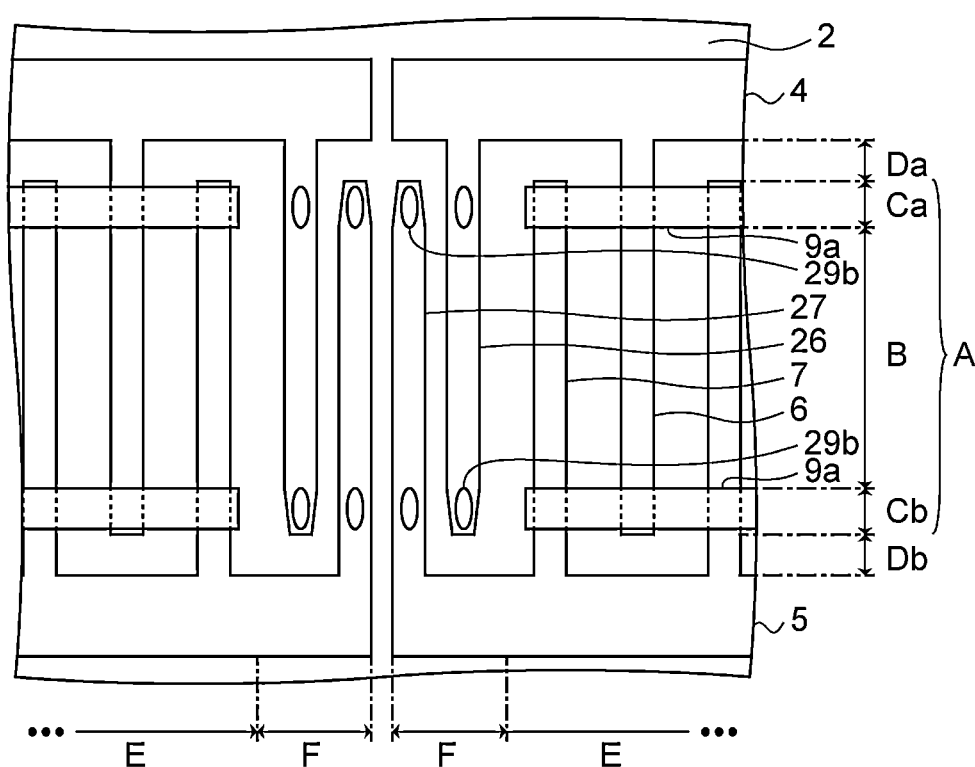
FIG. 3 is a plan view illustrating a portion of an acoustic wave device according to a first modification of the first preferred embodiment of the present invention.

In the first modification illustrated in FIG. 3, the shape of the electrode finger in the second pitch portion F is different from that of the first preferred embodiment. The width of the plurality of electrode fingers in the second pitch portion F in the first edge region Ca and the second edge region Cb is equal to or less than the width in the central region B. More specifically, the width of a portion of the plurality of electrode fingers including tip portions in the second pitch portion F is equal to or less than the width in the central region B. Here, the tip portions of second electrode fingers 27 are included in the first edge region Ca. In the first edge region Ca, the width of the second electrode finger 27 decreases from the central region B side toward the tip side. Therefore, the width of the tip of the second electrode finger 27 is narrower than the width of the second electrode finger 27 in the central region B. Thus, the width of the second electrode finger 27 in the first edge region Ca is equal to or less than the width of the second electrode finger 27 in the central region B. Note that the width of first electrode fingers 26 in the first edge region Ca is the same as the width of the first electrode fingers 26 in the central region B. Note that as described above, the width of the electrode finger is the dimension of the electrode finger in the first direction x.

On the other hand, the tip portions of the first electrode fingers 26 are included in the second edge region Cb. In the second edge region Cb, the width of the first electrode finger 26 decreases from the central region B side toward the tip side. Therefore, the width of the tip of the first electrode finger 26 is narrower than the width of the first electrode finger 26 in the central region B. Thus, the width of the first electrode finger 26 in the second edge region Cb is equal to or less than the width of the electrode finger in the central region B. Note that the width of the second electrode finger 27 in the second edge region Cb is the same as the width of the second electrode finger 27 in the central region B.

Here, in FIG. 3, the width of the plurality of electrode fingers in the first pitch portion E in the first edge region Ca and the second edge region Cb is the same as the width in the central region B. However, the width of a portion of the plurality of electrode fingers in the first pitch portion E in the first edge region Ca or the second edge region Cb may be narrower than the width in the central region B. Specifically, in the first pitch portion E, the width of the second electrode finger 7 in the first edge region Ca may be equal to or less than the width of the second electrode finger 7 in the central region B. For example, the width of the second electrode finger 7 in the first pitch portion E may decrease from the central region B side toward the tip side in the first edge region Ca. In addition, in the first pitch portion E, the width of the first electrode finger 6 in the second edge region Cb may be equal to or less than the width of the first electrode finger 6 in the central region B. For example, the width of the first electrode finger 6 in the first pitch portion E may decrease from the central region B side toward the tip side in the second edge region Cb.

Further, in the present modification, the shape of a second mass addition film 29b is different from that of the first preferred embodiment. To be more specific, in the first preferred embodiment, the shape of the second mass addition film 9b is rectangular. On the other hand, in the present modification, the shape of the second mass addition film 29b is substantially elliptical. In the second pitch portion F, when the width of the second electrode finger 27 in the first edge region Ca is equal to or smaller than the width of the second electrode finger 27 in the central region B, the second mass addition film 29b provided at the second electrode finger 27 may have a rounded shape as in the present modification.

Figure 4:
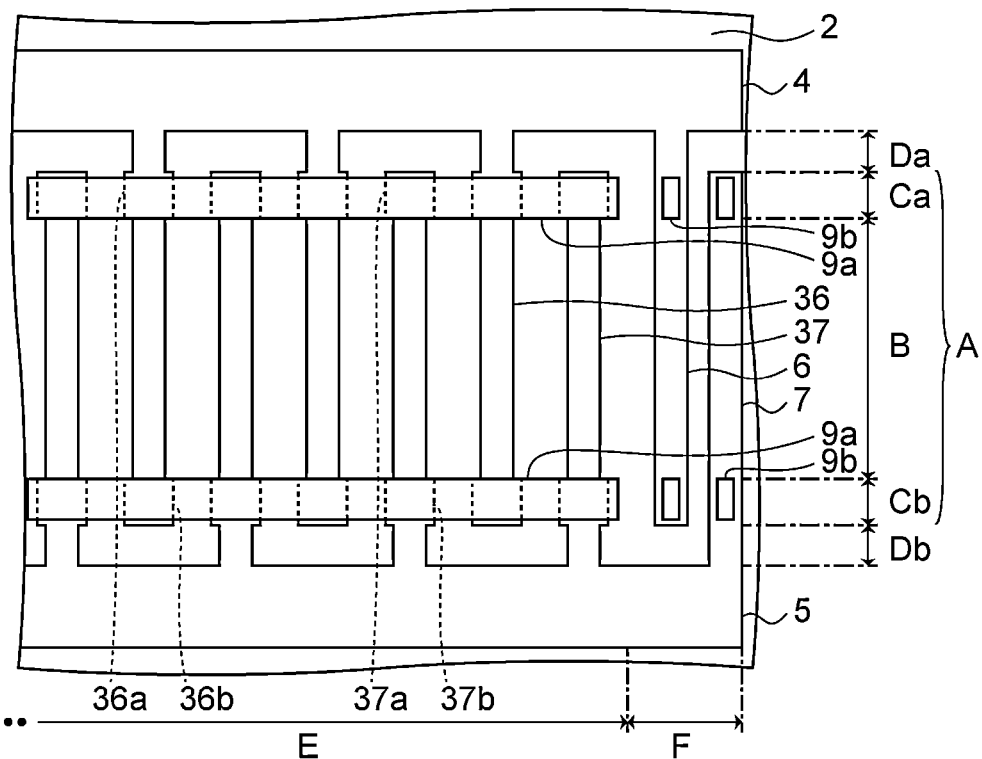
FIG. 4 is a plan view illustrating a portion of an acoustic wave device according to a second modification of the first preferred embodiment of the present invention.

In the second modification illustrated in FIG. 4, a first electrode finger 36 in the first pitch portion E has a wide portion 36a and a wide portion 36b. The wide portion 36a and the wide portion 36b are portions where the width of the electrode finger is wider than widths of other portions. The wide portion 36a is located in the first edge region Ca. The wide portion 36b is located in the second edge region Cb. Similarly, a second electrode finger 37 in the first pitch portion E has a wide portion 37a and a wide portion 37b. The wide portion 37a is located in the first edge region Ca. The wide portion 37b is located in the second edge region Cb.

In the present modification, all the first electrode fingers 36 in the first pitch portion E have the wide portion 36a and the wide portion 36b. All the second electrode fingers 37 in the first pitch portion E have the wide portion 37a and the wide portion 37b. Note that the first pitch portion E may include the first electrode fingers 26 that do not have the wide portion 36a or the wide portion 36b. The first pitch portion E may include the second electrode fingers 27 that do not have the wide portion 37a or the wide portion 37b.

Here, the electrode finger pitch is narrow in the second pitch portion F. Therefore, when the plurality of electrode fingers in the second pitch portion F has a wide portion, surge resistance may be deteriorated. On the other hand, in the present modification, the plurality of electrode fingers in the second pitch portion F does not have a wide portion. Therefore, the surge resistance is unlikely to deteriorate.

In the first pitch portion E of the present modification, the acoustic velocity in the first edge region Ca and the second edge region Cb is low due to both the wide portions and the first mass addition films 9a. Here, in a case of the present modification, it is preferable that the first mass addition film 9a be thicker than the second mass addition film 9b. In this case, it is easier to further adjust to the optimal conditions for suppressing the transverse mode in the first pitch portion E and the second pitch portion F. Therefore, the transverse mode can be more reliably suppressed.

Figure 5:
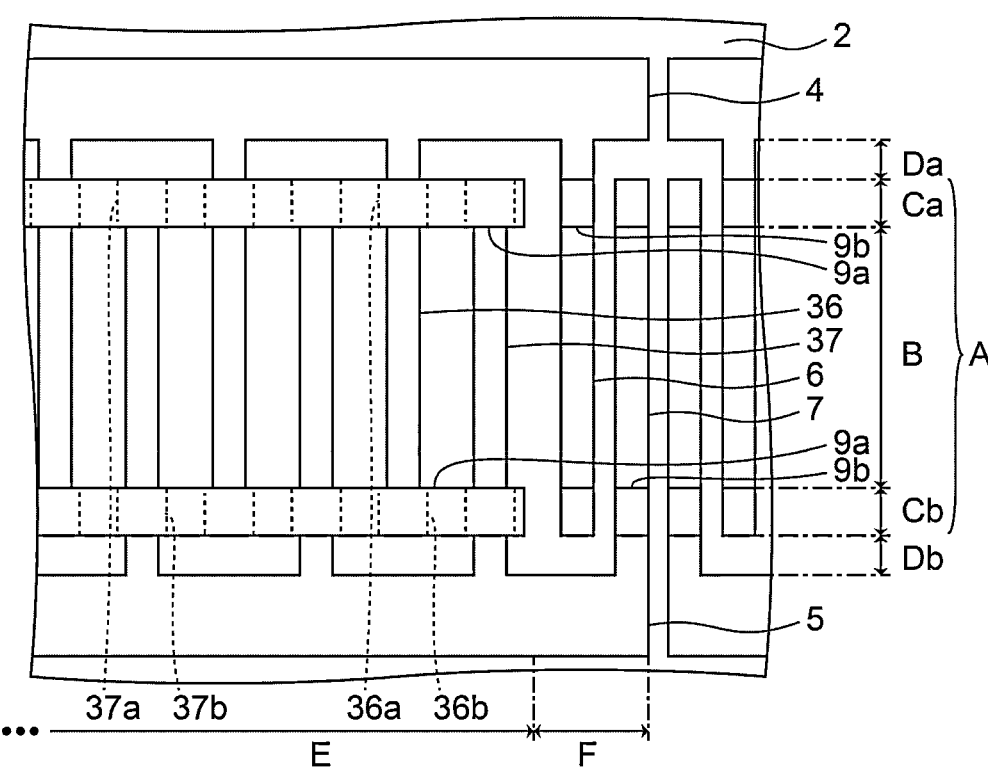
FIG. 5 is a plan view illustrating a portion of an acoustic wave device according to a third modification of the first preferred embodiment of the present invention.
Figure 6:
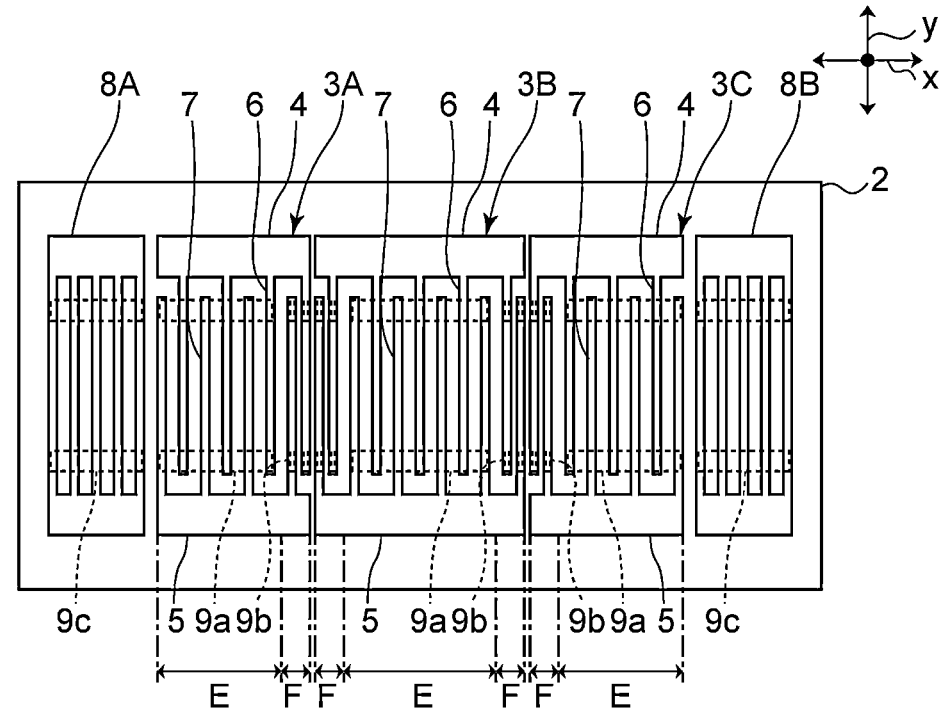
FIG. 6 is a plan view of an acoustic wave device according to a fourth modification of the first preferred embodiment of the present invention.

As illustrated in FIG. 1, the first mass addition film 9a and the second mass addition film 9b are provided on the IDT electrode 3A, the IDT electrode 3B, and the IDT electrode 3C. To be more specific, the first mass addition film 9a and the second mass addition film 9b are provided on the side of the plurality of electrode fingers opposite to the piezoelectric substrate 2 side. However, each of the second mass addition films 9b only needs to overlap one of the electrode fingers in a plan view. In this case, as in the second modification illustrated in FIG. 4, an end edge of each second mass addition film 9b may be provided on the inner side of an end edge of the electrode finger in a plan view. Alternatively, as in a third modification illustrated in FIG. 5, the end edge of each second mass addition film 9b may be provided so as to extend to the end edge of the electrode finger in a plan view. Each of the first mass addition films 9a may overlap the plurality of electrode fingers in a plan view. In a fourth modification of the first preferred embodiment illustrated in FIG. 6, the first mass addition films 9a and the second mass addition films 9b are provided between each of the IDT electrodes and the piezoelectric substrate 2. To be more specific, the first mass addition films 9a and the second mass addition films 9b are provided between the plurality of electrode fingers and the piezoelectric substrate 2. A band-shaped mass addition film is also provided between the piezoelectric substrate 2 and each of the reflector 8A and the reflector 8B. Note that in FIG. 6, each of the mass addition films is indicated by a broken line.

In the first preferred embodiment and the modifications thereof, the first mass addition film 9a has a band shape. However, it is sufficient that the length of the first mass addition film 9a is greater than the length of the second mass addition film 9b, and the first mass addition film 9a does not have to be band-shaped.

Figure 7:
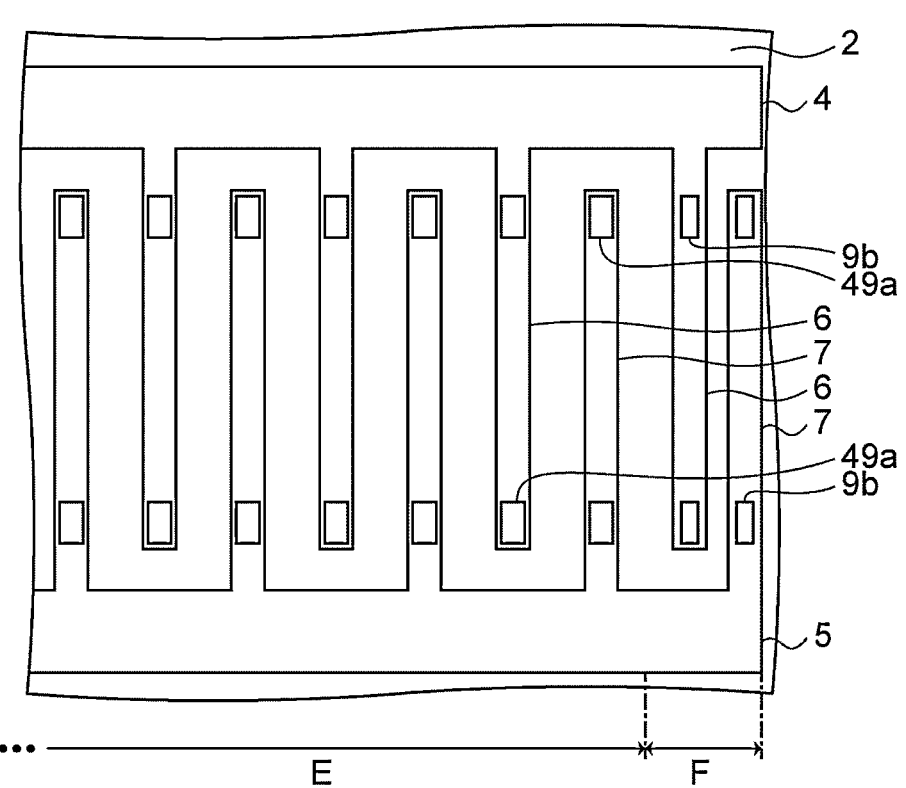
FIG. 7 is a plan view illustrating a portion of an acoustic wave device according to a second preferred embodiment of the present invention.

FIG. 7 is a plan view illustrating a portion of an acoustic wave device according to a second preferred embodiment.

The present preferred embodiment is different from the first preferred embodiment in that a first mass addition film 49a has an individual piece shape. Each of the first mass addition films 49a is provided so as to overlap one of the electrode fingers in a plan view. The first mass addition film 49a is not disposed between the electrode fingers. In other respects, the acoustic wave device of the second preferred embodiment has the same configuration as that of the acoustic wave device 1 of the first preferred embodiment.

Also in the present preferred embodiment, suitable conditions for suppressing the transverse mode can be obtained, in both the first pitch portion E and the second pitch portion F. Therefore, the transverse mode can be effectively suppressed.

Note that the first mass addition film 49a may extend to a portion between the electrode fingers on the piezoelectric substrate 2. In this case, for example, the two first mass addition films 49a may extend to the same portion between the electrode fingers on the piezoelectric substrate 2.

In the first preferred embodiment and the modifications thereof, and the second preferred embodiment, the first mass addition film is disposed in the first pitch portion, and the second mass addition film is disposed in the second pitch portion. In the following description, an example in which the same mass addition film is disposed in the first pitch portion and the second pitch portion will be described.

Figure 8:
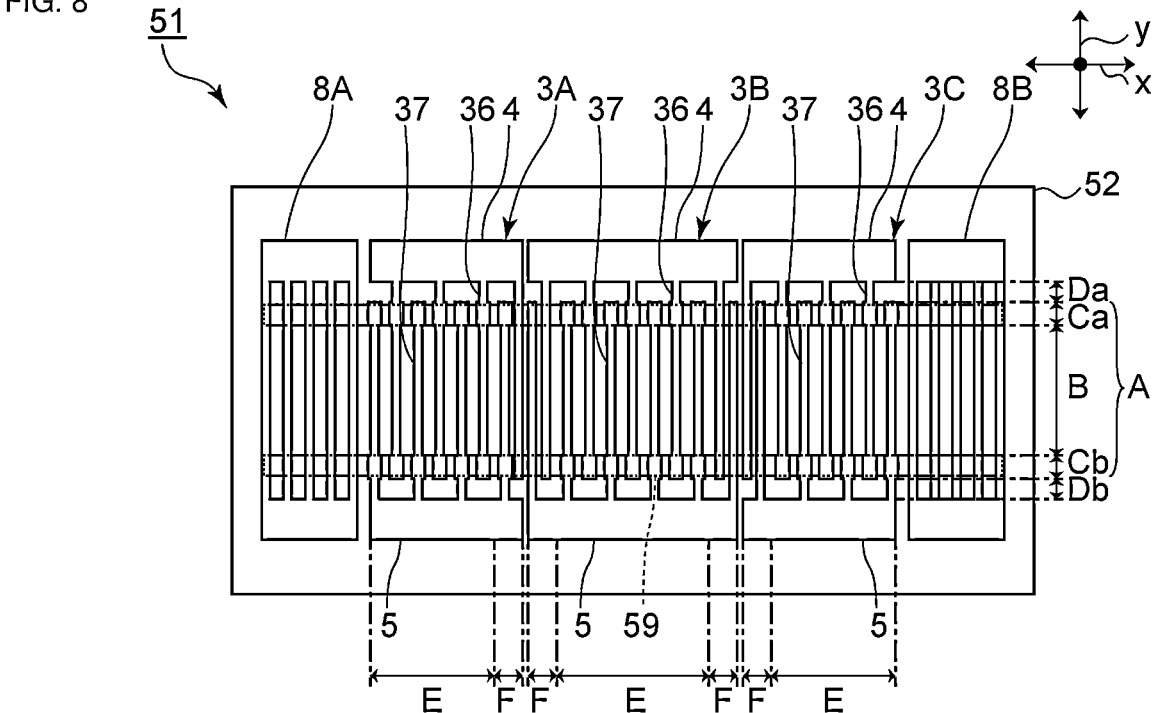
FIG. 8 is a plan view of an acoustic wave device according to a third preferred embodiment of the present invention.
Figure 9:
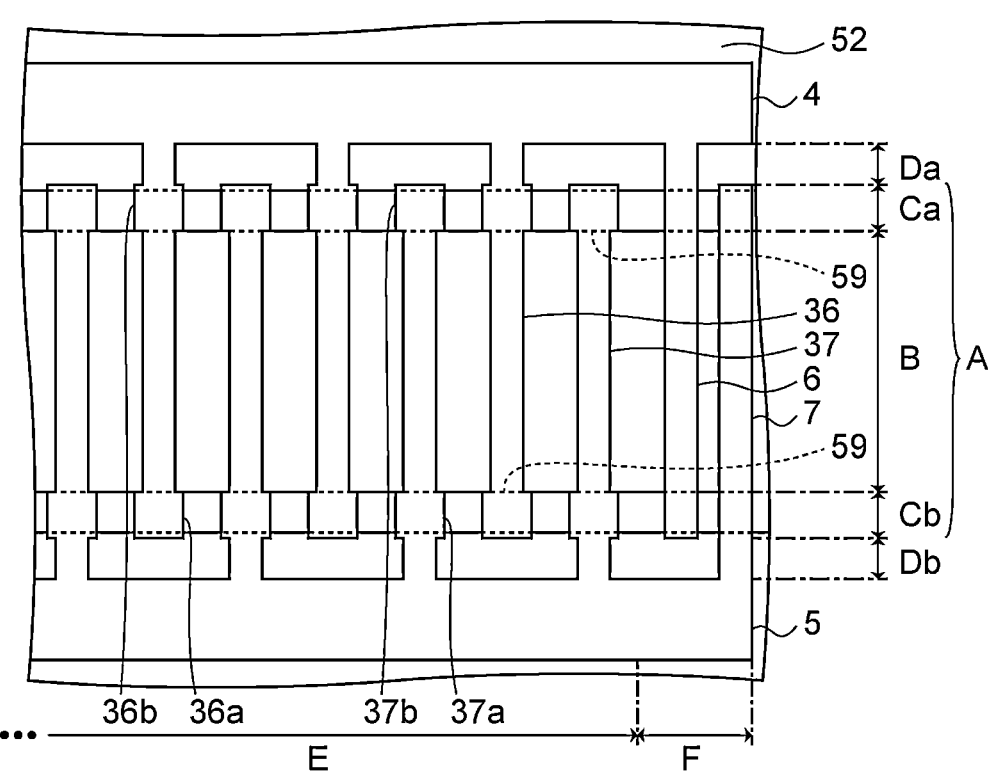
FIG. 9 is a plan view illustrating a portion of the acoustic wave device according to the third preferred embodiment of the present invention.

FIG. 8 is a plan view of an acoustic wave device according to a third preferred embodiment. FIG. 9 is a plan view illustrating a portion of the acoustic wave device according to the third preferred embodiment.

As illustrated in FIG. 8, in the present preferred embodiment, one mass addition film 59 is provided so as to overlap the portions of the plurality of electrode fingers located in the first edge region Ca in a plan view. The mass addition film 59 has a band shape. More specifically, the mass addition film 59 is provided on both the plurality of electrode fingers and portions located between the plurality of electrode fingers. The mass addition film 59 is provided between the piezoelectric substrate 52 and each of the IDT electrode 3A, the IDT electrode 3B, and the IDT electrode 3C. In this manner, one mass addition film 59 overlaps all the IDT electrodes in an acoustic wave device 51 in a plan view. Therefore, the mass addition film 59 overlaps both the electrode fingers in the first pitch portion E and the electrode fingers in the second pitch portion F in a plan view. Similarly, one mass addition film 59 is provided so as to overlap portions of the plurality of electrode fingers located in the second edge region Cb in a plan view.

As illustrated in FIG. 9, in the present preferred embodiment, the plurality of electrode fingers in the first pitch portion E has the same configuration as that of the second modification of the first preferred embodiment illustrated in FIG. 4. To be more specific, all the first electrode fingers 36 in the first pitch portion E have the wide portion 36a and the wide portion 36b. All the second electrode fingers 37 in the first pitch portion E have the wide portion 37a and the wide portion 37b. Note that the first pitch portion E may include the first electrode fingers 26 that do not have the wide portion 36a or the wide portion 36b. The first pitch portion E may include the second electrode fingers 27 that do not have the wide portion 37a or the wide portion 37b.

In the present preferred embodiment, the mass addition film 59 is provided between a piezoelectric substrate 52 and each of the IDT electrode 3A, the IDT electrode 3B, and the IDT electrode 3C. However, the mass addition film 59 may be provided on the IDT electrode 3A, the IDT electrode 3B, and the IDT electrode 3C.

Figure 10:
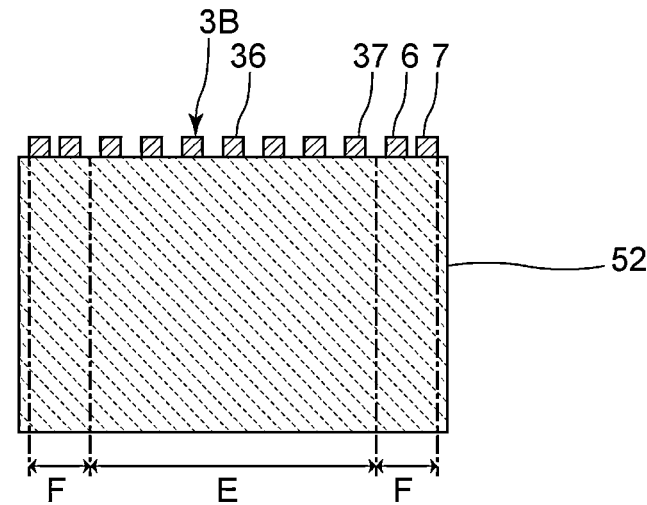
FIG. 10 is a front cross-sectional view illustrating a portion of the acoustic wave device according to the third preferred embodiment of the present invention.

FIG. 10 is a front cross-sectional view illustrating a portion of the acoustic wave device according to the third preferred embodiment.

The piezoelectric substrate 52 of the acoustic wave device 51 is a piezoelectric substrate including only a piezoelectric layer. More specifically, the piezoelectric substrate 52 is a lithium niobate substrate. However, the material and the layer configuration of the piezoelectric substrate 52 are not limited to those described above. For example, it may have the above-described layer configuration of two layers or three layers, or may have the same layer configuration as that of the first preferred embodiment. Alternatively, the piezoelectric substrate 52 may be a lithium tantalate substrate or the like.

Unique features of the present preferred embodiment are as follows. 1) At least one IDT electrode has the first pitch portion E and the second pitch portion F. 2) The width of the plurality of electrode fingers in the first pitch portion E in the first edge region Ca and the second edge region Cb is wider than the width in the central region B. 3) The band-shaped mass addition film 59 is disposed in the first pitch portion E and the second pitch portion F. 4) The mass addition film 59 overlaps the portions of the plurality of electrode fingers located in the first edge region Ca and the second edge region Cb in a plan view.

In the acoustic wave device 51, in the first pitch portion E and the second pitch portion F, the shapes of the electrode fingers are different between the first edge region Ca and the second edge region Cb. More specifically, the plurality of electrode fingers in the second pitch portion F does not have a wide portion, and the plurality of electrode fingers in the first pitch portion E has a wide portion. On the other hand, the same mass addition film 59 is disposed in the first pitch portion E and the second pitch portion F. Accordingly, in both the first pitch portion E and the second pitch portion F, the suitable conditions for suppressing the transverse mode can be obtained. Therefore, the transverse mode can be effectively suppressed in the acoustic wave device 51 as a whole.

In addition, the width of the mass addition film 59 is constant, and the width of the low acoustic velocity region is also constant. Therefore, the deterioration of the insertion loss can be reduced or prevented.

Note that in the present preferred embodiment, the mass addition film 59 extends from between the reflector 8A and the piezoelectric substrate 52 to between the reflector 8B and the piezoelectric substrate 52. However, the mass addition film 59 need not overlap the reflector 8A and the reflector 8B in a plan view.

In the present preferred embodiment, one mass addition film 59 is provided in each of the first edge region Ca and the second edge region Cb. Each of the mass addition films 59 overlaps all the IDT electrodes in a plan view. Note that the mass addition film 59 need not be provided between the IDT electrodes. In this case, the plurality of mass addition films 59 overlaps the portions of the plurality of IDT electrodes located in the first edge region Ca in a plan view. For example, the mass addition film 59 overlapping the portion of the IDT electrode 3A located in the first edge region Ca in a plan view is not integrated with the mass addition film 59 overlapping the portion of the IDT electrode 3B located in the first edge region Ca in a plan view. However, as in the present preferred embodiment, it is preferable that one mass addition film 59 overlaps the plurality of IDT electrodes in a plan view. In this case, it is possible to easily form the mass addition film 59, and productivity can be improved.

The electrode fingers in the second pitch portion F may be configured in the same manner as in the first modification of the first preferred embodiment. More specifically, among the plurality of electrode fingers in the second pitch portion F, in the electrode fingers whose tip portions are included in the first edge region Ca or the second edge region Cb, the width of a portion including the tip portion in the edge region may be equal to or less than the width in the central region B.

Figure 11:
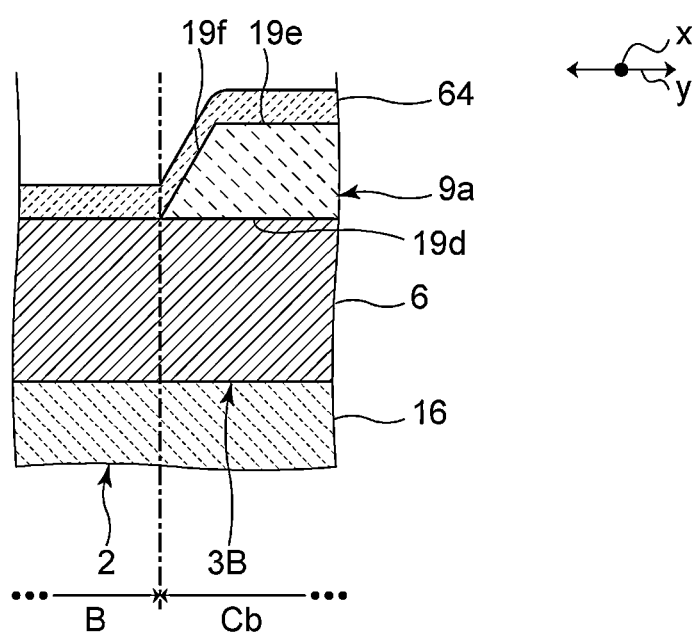
FIG. 11 is a cross-sectional view illustrating a portion of a cross section along a second direction of an acoustic wave device according to a fourth preferred embodiment of the present invention.

FIG. 11 is a cross-sectional view illustrating a portion of a cross section along the second direction of an acoustic wave device according to a fourth preferred embodiment. More specifically, FIG. 11 illustrates a portion of the first electrode finger 6 and the like in the vicinity of the boundary between the central region B and the second edge region Cb.

The present preferred embodiment is different from the first preferred embodiment in that a protective film 64 is provided on the piezoelectric substrate 2. Except for the above point, the acoustic wave device of the present preferred embodiment has the same configuration as that of the acoustic wave device 1 of the first preferred embodiment.

The protective film 64 covers the IDT electrode 3B and the plurality of first mass addition films 9a. Furthermore, the protective film 64 also covers the IDT electrode 3A, the IDT electrode 3C, and the plurality of second mass addition films 9b illustrated with reference to FIG. 1. Each IDT electrode includes a portion directly covered with the protective film 64 and a portion indirectly covered with the protective film 64 via each mass addition film. Since the protective film 64 is provided, each IDT electrode is less likely to be damaged.

As illustrated in FIG. 11, the first mass addition film 9a has a first main surface 19d, a second main surface 19e, and a side surface 19f. The first main surface 19d is in contact with the IDT electrode 3B. The second main surface 19e faces the first main surface 19d. The side surface 19f is connected to the first main surface 19d and the second main surface 19e. The side surface 19f is inclined with respect to a thickness direction of the first mass addition film 9a. Note that the thickness direction of the first mass addition film 9a is a direction in which the first main surface 19d and the second main surface 19e face each other. Like the first mass addition film 9a, the second mass addition film 9b illustrated with reference to FIG. 1 also has a first main surface, a second main surface, and a side surface. The side surface of the second mass addition film 9b is also inclined with respect to the thickness direction of the second mass addition film 9b. However, the side surface of each mass addition film does not necessarily have to be inclined.

In the present preferred embodiment, in the protective film 64, a portion covering the side surface 19f of each first mass addition film 9a is thinner than a portion covering the second main surface 19e of each first mass addition film 9a and a portion directly covering each of the IDT electrodes. Further, in the protective film 64, a portion covering the side surface of each second mass addition film 9b is thinner than a portion covering the second main surface of each second mass addition film 9b and a portion directly covering each of the IDT electrodes. Thus, even when the side surfaces of the first mass addition films 9a and the second mass addition films 9b are inclined, the change in the acoustic velocity in the vicinity of the boundary between the central region B and the second edge region Cb can be made steep. More specifically, in the vicinity of the boundary described above, the inclination of the change in the acoustic velocity with respect to the distance in the second direction y can be increased. Similarly, the change of the acoustic velocity in the vicinity of the boundary between the central region B and the first edge region Ca can also be made steep. Therefore, the transverse mode can be effectively suppressed.

Figure 12:
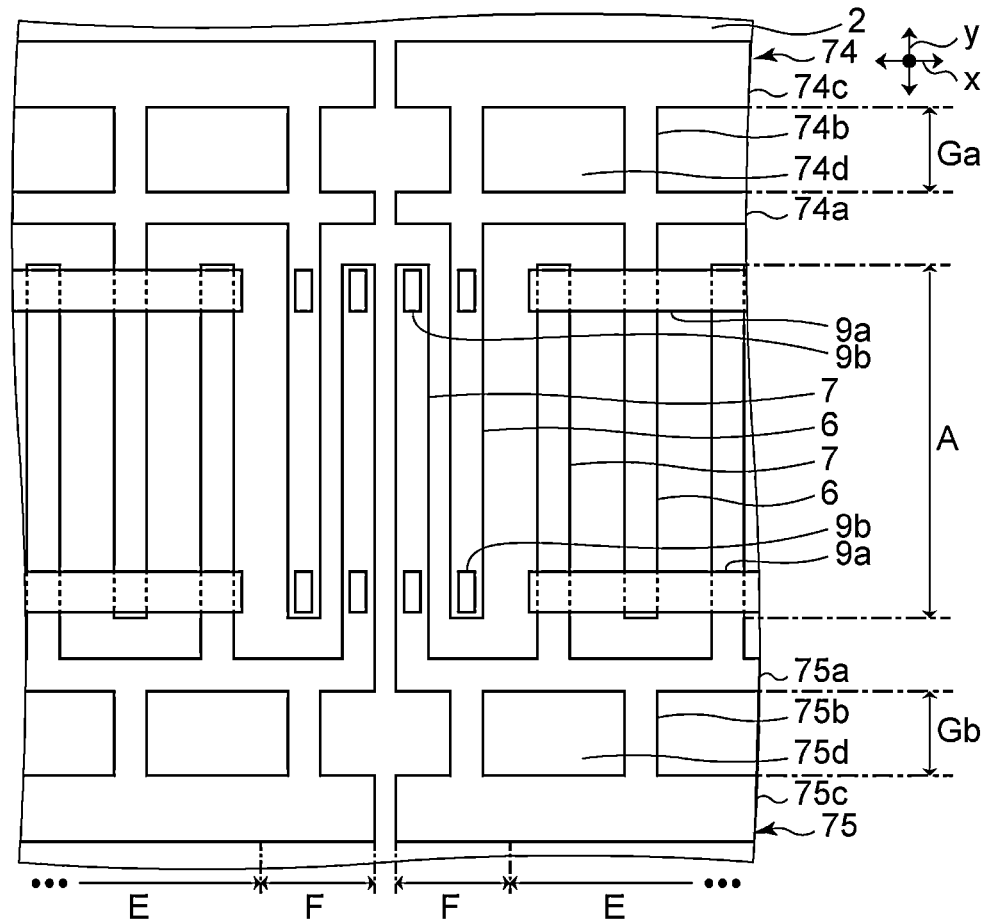
FIG. 12 is a plan view illustrating a portion of an acoustic wave device according to a fifth preferred embodiment of the present invention.

FIG. 12 is a plan view illustrating a portion of an acoustic wave device according to a fifth preferred embodiment.

The present preferred embodiment is different from the first preferred embodiment in that a plurality of cavities is provided along the first direction x in each of a first busbar 74 and a second busbar 75 of each IDT electrode. Except for the above point, the acoustic wave device of the present preferred embodiment has the same configuration as that of the first preferred embodiment.

The first busbar 74 has a first cavity formation region Ga. A plurality of cavities 74d is provided in the first cavity formation region Ga. Further, the first busbar 74 includes an inner busbar portion 74a, an outer busbar portion 74c, and a plurality of connection electrodes 74b. The first cavity formation region Ga is located between the inner busbar portion 74a and the outer busbar portion 74c in the second direction y. Note that the inner busbar portion 74a of the inner busbar portion 74a and the outer busbar portion 74c is located on the intersecting region A side. The inner busbar portion 74a and the outer busbar portion 74c are connected by the plurality of connection electrodes 74b. The plurality of cavities 74d include cavities surrounded by the inner busbar portion 74a, the outer busbar portion 74c, and the plurality of connection electrodes 74b.

Similarly, the second busbar 75 has a second cavity formation region Gb. A plurality of cavities 75d is provided in the second cavity formation region Gb. Further, the second busbar 75 includes an inner busbar portion 75a, an outer busbar portion 75c, and a plurality of connection electrodes 75b. The plurality of cavities 75d includes cavities surrounded by the inner busbar portion 75a, the outer busbar portion 75c, and the plurality of connection electrodes 75b. In the present preferred embodiment, a high acoustic velocity region is formed in the first cavity formation region Ga and the second cavity formation region Gb.

Also in the present preferred embodiment, as in the first preferred embodiment, the first mass addition film 9a is disposed in the first pitch portion E, and the second mass addition film 9b is disposed in the second pitch portion F. Therefore, the transverse mode can be effectively suppressed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate; and
a plurality of interdigital transducer (IDT) electrodes extending in an acoustic wave propagation direction on the piezoelectric substrate and each including a pair of busbars and a plurality of electrode fingers; wherein
at least one of the plurality of IDT electrodes includes a first pitch portion in which an electrode finger pitch is relatively wide and a second pitch portion in which an electrode finger pitch is relatively narrow;
a portion in which the plurality of electrode fingers adjacent to each other overlap each other in the acoustic wave propagation direction is an intersecting region, the intersecting region includes a central region located on a central side in a direction in which the plurality of electrode fingers extend, and a pair of edge regions are provided on both sides of the central region in the direction in which the plurality of electrode fingers extend and including respective tip portions of the plurality of electrode fingers;
in each of the plurality of IDT electrodes, a pair of gap regions is between the intersecting region and the pair of busbars;
a plurality of mass addition films overlap portions of the plurality of electrode fingers in the pair of edge regions in a plan view;
the plurality of mass addition films includes a plurality of first mass addition films in the first pitch portion and a plurality of second mass addition films in the second pitch portion;
one of the plurality of first mass addition films overlaps at least one of the plurality of electrode fingers in a plan view;
each of the plurality of second mass addition films overlaps one of the plurality of electrode fingers but does not overlap another of the plurality of electrode fingers adjacent to the one of the plurality of electrode fingers in a plan view; and
a length of one of the plurality of first mass addition films along the acoustic wave propagation direction is greater than a length of one of the plurality of second mass addition films along the acoustic wave propagation direction.

2. The acoustic wave device according to claim 1, wherein a width of each of the plurality of electrode fingers in the second pitch portion in the pair of edge regions is equal to or less than a width of each of the plurality of electrode fingers in the central region.

3. The acoustic wave device according to claim 1, wherein each of the plurality of first mass addition films overlaps the plurality of electrode fingers in the first pitch portion and a portion located between the plurality of electrode fingers in a plan view.

4. The acoustic wave device according to claim 1, wherein each of the plurality of first mass addition films overlaps one of the plurality of electrode fingers but does not overlap another of the plurality of electrode fingers adjacent to the one of the plurality of electrode fingers in a plan view.

5. The acoustic wave device according to claim 1, wherein a length of the plurality of first mass addition film along the direction in which the plurality of electrode fingers extend is equal to a length of the plurality of second mass addition film along the direction in which the plurality of electrode fingers extend.

6. The acoustic wave device according to claim 1, wherein the plurality of mass addition films is on a side of the plurality of electrode fingers opposite to the piezoelectric substrate side.

7. The acoustic wave device according to claim 6, wherein
each of the plurality of mass addition films includes a first main surface in contact with one of the plurality of IDT electrodes, a second main surface facing the first main surface, and a side surface connected to the first main surface and the second main surface, the side surface being inclined with respect to a thickness direction of the mass addition film;
a protective film on the piezoelectric substrate covers the plurality of IDT electrodes and the plurality of mass addition films; and
in the protective film, a thickness of a portion covering the side surface of the mass addition film is less than a thickness of a portion covering the second main surface of the mass addition film, and a thickness of a portion directly covering the one of the plurality of IDT electrodes.

8. The acoustic wave device according to claim 1, wherein the plurality of mass addition films are between the plurality of electrode fingers and the piezoelectric substrate.

9. The acoustic wave device according to claim 1, wherein a plurality of cavities is provided at each of the pair of busbars of the plurality of IDT electrodes along the acoustic wave propagation direction.

10. The acoustic wave device according to claim 1, wherein
the piezoelectric substrate is a laminated substrate in which a support substrate, a high acoustic velocity film, a low acoustic velocity film, and a piezoelectric layer are laminated in this order;
an acoustic velocity of a bulk wave propagating through the low acoustic velocity film is lower than an acoustic velocity of a bulk wave propagating through the piezoelectric layer; and
an acoustic velocity of a bulk wave propagating through the high acoustic velocity film is higher than an acoustic velocity of an acoustic wave propagating through the piezoelectric layer.

11. The acoustic wave device according to claim 1, wherein the acoustic wave device is a longitudinally coupled resonator acoustic wave filter further including a reflector provided on both sides of the plurality of IDT electrodes on the piezoelectric substrate in the acoustic wave propagation direction.

12. An acoustic wave device comprising:
a piezoelectric substrate; and
a plurality of interdigital transducer (IDT) electrodes extending in an acoustic wave propagation direction on the piezoelectric substrate and each including a pair of busbars and a plurality of electrode fingers; wherein
at least one of the plurality of IDT electrodes includes a first pitch portion in which an electrode finger pitch is relatively wide and a second pitch portion in which an electrode finger pitch is relatively narrow;

a portion in which the plurality of electrode fingers adjacent to each other overlap each other in the acoustic wave propagation direction is an intersecting region, the intersecting region includes a central region located on a central side in a direction in which the plurality of electrode fingers extend, and a pair of edge regions are provided on both sides of the central region in the direction in which the plurality of electrode fingers extend and include respective tip portions of the plurality of electrode fingers;

in each of the plurality of IDT electrodes, a pair of gap regions is between the intersecting region and the pair of busbars;

a width of each of the plurality of electrode fingers in the first pitch portion in the pair of edge regions is greater than a width of each of the plurality of electrode fingers in the central region;

a width of each of the plurality of electrode fingers in the second pitch portion in the pair of edge regions is equal to or less than a width of each of the plurality of electrode fingers in the central region;

a plurality of mass addition films overlap portions of the plurality of electrode fingers in the first pitch portion and the second pitch portion located in the pair of edge regions in a plan view; and each of the plurality of mass addition films overlaps the plurality of electrode fingers and a portion located between the plurality of electrode fingers in a plan view.

13. The acoustic wave device according to claim 12, wherein each of the plurality of mass addition films overlaps all the plurality of IDT electrodes in a plan view.

14. The acoustic wave device according to claim 12, wherein the plurality of mass addition films is on a side of the plurality of electrode fingers opposite to the piezoelectric substrate side.

15. The acoustic wave device according to claim 14, wherein each of the plurality of mass addition films includes a first main surface in contact with one of the plurality of IDT electrodes, a second main surface facing the first main surface, and a side surface connected to the first main surface and the second main surface, the side surface being inclined with respect to a thickness direction of the mass addition film;

a protective film on the piezoelectric substrate covers the plurality of IDT electrodes and the plurality of mass addition films; and in the protective film, a thickness of a portion covering the side surface of the mass addition film is less than a thickness of a portion covering the second main surface of the mass addition film, and a thickness of a portion directly covering the one of the plurality of IDT electrodes.

16. The acoustic wave device according to claim 12, wherein the plurality of mass addition films are between the plurality of electrode fingers and the piezoelectric substrate.

17. The acoustic wave device according to claim 12, wherein a plurality of cavities is provided at each of the pair of busbars of the plurality of IDT electrodes along the acoustic wave propagation direction.

18. The acoustic wave device according to claim 12, wherein the piezoelectric substrate is a laminated substrate in which a support substrate, a high acoustic velocity film, a low acoustic velocity film, and a piezoelectric layer are laminated in this order;

an acoustic velocity of a bulk wave propagating through the low acoustic velocity film is lower than an acoustic velocity of a bulk wave propagating through the piezoelectric layer; and an acoustic velocity of a bulk wave propagating through the high acoustic velocity film is higher than an acoustic velocity of an acoustic wave propagating through the piezoelectric layer.

19. The acoustic wave device according to claim 12, wherein the acoustic wave device is a longitudinally coupled resonator acoustic wave filter further including a reflector provided on both sides of the plurality of IDT electrodes on the piezoelectric substrate in the acoustic wave propagation direction.

* * * * *